(12) United States Patent
Huang et al.

(10) Patent No.: US 11,380,593 B2
(45) Date of Patent: Jul. 5, 2022

(54) SEMICONDUCTOR FIN CUTTING PROCESS AND STRUCTURES FORMED THEREBY

(71) Applicant: Taiwan Semiconductor Manufacturing Co., Ltd., Hsinchu (TW)

(72) Inventors: Shih-Wen Huang, Tainan (TW); Jaming Chang, Hsinchu (TW); Kai Hung Cheng, Tainan (TW); Chia-Hui Lin, Dajia Township (TW); Jei Ming Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/019,475

(22) Filed: Sep. 14, 2020

(65) Prior Publication Data

US 2020/0411386 A1    Dec. 31, 2020

Related U.S. Application Data

(63) Continuation of application No. 15/922,656, filed on Mar. 15, 2018, now Pat. No. 10,777,466.

(Continued)

(51) Int. Cl.
*H01L 27/088* (2006.01)
*H01L 21/8234* (2006.01)
(Continued)

(52) U.S. Cl.
CPC .. *H01L 21/823481* (2013.01); *H01L 21/0217* (2013.01); *H01L 21/0228* (2013.01);
(Continued)

(58) Field of Classification Search
CPC ..... H01L 21/823481; H01L 21/823431; H01L 29/0653; H01L 21/0228; H01L 21/0217; H01L 21/02164; H01L 21/02178; H01L 21/02181; H01L 21/02183; H01L 21/02186; H01L 21/02189;
(Continued)

(56) References Cited

U.S. PATENT DOCUMENTS 8,987,836 B2  3/2015  Kim et al.
9,006,067 B2  4/2015  Kang et al.
(Continued)

FOREIGN PATENT DOCUMENTS

KR    20160032939 A    3/2016
KR    20160056693 A    5/2016
(Continued)

*Primary Examiner* — Ismail A Muse
(74) *Attorney, Agent, or Firm* — Slater Matsil, LLP

(57) ABSTRACT

Methods of cutting fins, and structures formed thereby, are described. In an embodiment, a structure includes a first fin on a substrate, a second fin on the substrate, and a fin cut-fill structure disposed between the first fin and the second fin. The first fin and the second fin are longitudinally aligned. The fin cut-fill structure includes an insulating liner and a fill material on the insulating liner. The insulating liner abuts a first sidewall of the first fin and a second sidewall of the second fin. The insulating liner includes a material with a band gap greater than 5 eV.

20 Claims, 14 Drawing Sheets

Related U.S. Application Data

(60) Provisional application No. 62/591,647, filed on Nov. 28, 2017.

(51) Int. Cl.
*H01L 29/06* (2006.01)
*H01L 21/02* (2006.01)
*H01L 21/762* (2006.01)

(52) U.S. Cl.
CPC .. *H01L 21/02148* (2013.01); *H01L 21/02159* (2013.01); *H01L 21/02164* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/76224* (2013.01); *H01L 21/823431* (2013.01); *H01L 27/0886* (2013.01); *H01L 29/0653* (2013.01)

(58) Field of Classification Search
CPC ......... H01L 21/02148; H01L 21/02159; H01L 21/76224; H01L 27/0886; H01L 29/66795; H01L 29/66545
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,704,751 B1 | 7/2017 | Chang et al. | |
| 9,831,183 B2 | 11/2017 | Lin et al. | |
| 9,859,386 B2 | 1/2018 | Ho et al. | |
| 10,283,415 B2 | 5/2019 | Hsu et al. | |
| 2007/0134884 A1 | 6/2007 | Kim et al. | |
| 2008/0230373 A1 | 9/2008 | Kim et al. | |
| 2008/0305561 A1 | 12/2008 | Govindarajan | |
| 2014/0038387 A1 | 2/2014 | Kishida | |
| 2014/0227857 A1 | 8/2014 | Youn et al. | |
| 2014/0374828 A1 | 12/2014 | Song et al. | |
| 2015/0104923 A1 | 4/2015 | Tsai et al. | |
| 2015/0111362 A1 | 4/2015 | Shieh et al. | |
| 2015/0228796 A1 | 8/2015 | Kim et al. | |
| 2016/0005738 A1 | 1/2016 | Liu et al. | |
| 2016/0056045 A1 | 2/2016 | Huang et al. | |
| 2016/0071857 A1 | 3/2016 | Kuge et al. | |
| 2016/0329249 A1 | 11/2016 | Chang et al. | |
| 2016/0351590 A1 | 12/2016 | Cheng et al. | |
| 2016/0380075 A1 | 12/2016 | Chung et al. | |
| 2017/0062584 A1 | 3/2017 | Basker et al. | |
| 2017/0092643 A1 | 3/2017 | Tseng et al. | |
| 2017/0103985 A1 | 4/2017 | Kim et al. | |
| 2017/0170182 A1 | 6/2017 | Balakrishnan et al. | |
| 2017/0207097 A1 | 7/2017 | Leobandung et al. | |
| 2017/0213823 A1 | 7/2017 | Cha | |
| 2017/0330957 A1 | 11/2017 | Cheng et al. | |
| 2018/0138174 A1* | 5/2018 | Min | H01L 29/0847 |
| 2018/0138269 A1 | 5/2018 | Kim et al. | |
| 2018/0211866 A1 | 7/2018 | Cheng et al. | |
| 2018/0211887 A1 | 7/2018 | Kim et al. | |
| 2018/0350585 A1 | 12/2018 | Cai | |
| 2019/0006345 A1 | 1/2019 | Wang et al. | |
| 2019/0067111 A1 | 2/2019 | Tsai et al. | |
| 2019/0172950 A1 | 6/2019 | Lilak et al. | |

FOREIGN PATENT DOCUMENTS

| | | |
|---|---|---|
| KR | 20170041515 A | 4/2017 |
| KR | 20170051120 A | 5/2017 |
| TW | 201727895 A | 8/2017 |
| TW | 201730978 A | 9/2017 |

* cited by examiner

SEMICONDUCTOR FIN CUTTING PROCESS AND STRUCTURES FORMED THEREBY

PRIORITY CLAIM AND CROSS-REFERENCE

This application is a continuation of U.S. patent application Ser. No. 15/922,656, filed on Mar. 15, 2018, now U.S. Pat. No. 10,777,466, entitled "Semiconductor Fin Cutting Process and Structures Formed Thereby," which claims the benefit of and priority to U.S. Provisional Patent Application No. 62/591,647, filed on Nov. 28, 2017, entitled "Semiconductor Structure Cutting Process and Structures Formed Thereby," each is incorporated herein by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIGS. 1, 2, 3A-B, 4A-D, 5A-C, 6A-C, 7A-C, 8A-C, 9A-C, 10A-C, 11A-C, 12A-C, and 13A-C are various views of respective intermediate structures at intermediate stages in an example process of forming a semiconductor device including one or more FinFETs in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of cutting an active area, such as a fin, in a semiconductor device, such as including a Fin Field-Effect Transistor (FinFET), are described herein, along with structures formed by the methods. Generally, a fin cut process is performed where a multiple (e.g., dual) insulator structure is formed where the fin is cut. The multiple insulator structure includes an insulating liner that includes or is a high band gap material, which can decrease leakage current between the sections of the fin that was cut.

Example embodiments described herein are described in the context of FinFETs. Implementations of some aspects of the present disclosure may be used in other processes and/or in other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1, 2, 3A-B, 4A-D, and 5A-C through 13A-C are various views of respective intermediate structures during intermediate stages in an example process of forming a semiconductor device including one or more FinFETs in accordance with some embodiments. FIG. 1 illustrates, in a cross-sectional view, a semiconductor substrate 20. The semiconductor substrate 20 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include silicon (Si); germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

Figure 2:
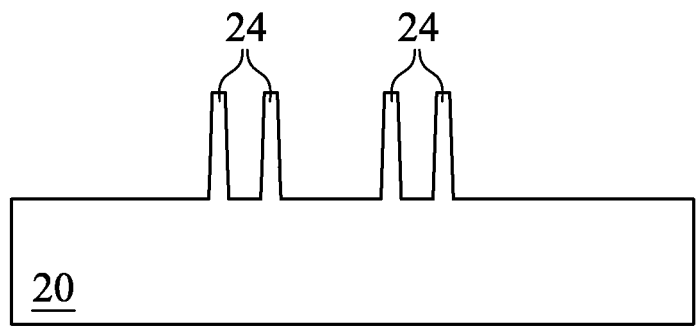

FIG. 2 illustrates, in a cross-sectional view, the formation of fins 24 in the semiconductor substrate 20. In some examples, a mask (e.g., a hard mask) is used in forming the fins 24. For example, one or more mask layers are deposited over the semiconductor substrate 20, and the one or more mask layers are then patterned into the mask. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask. The etch process may include a reactive ion etch (RIE), neutral beam etch (NBE), inductive coupled plasma (ICP) etch, the like, or a combination thereof. The etching may be anisotropic. Subsequently, the photo resist is removed in an ashing or wet strip processes, for example.

Using the mask, the semiconductor substrate 20 may be etched such that trenches are formed between neighboring pairs of fins 24 and such that the fins 24 protrude from the semiconductor substrate 20. The etch process may include a RIE, NBE, ICP etch, the like, or a combination thereof. The etching may be anisotropic.

Figure 3A:
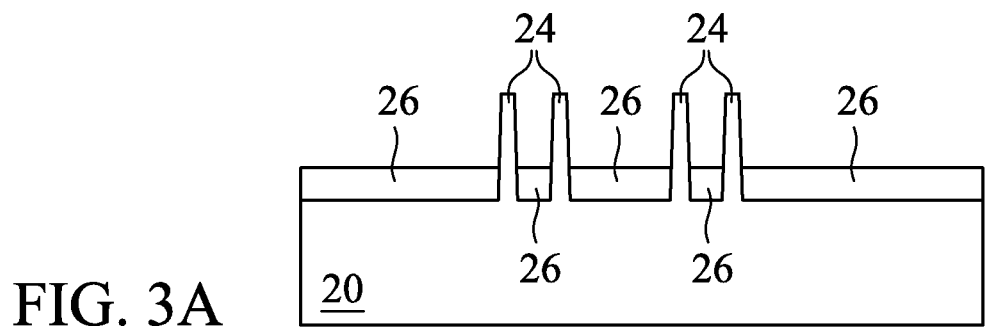
Figure 3B:
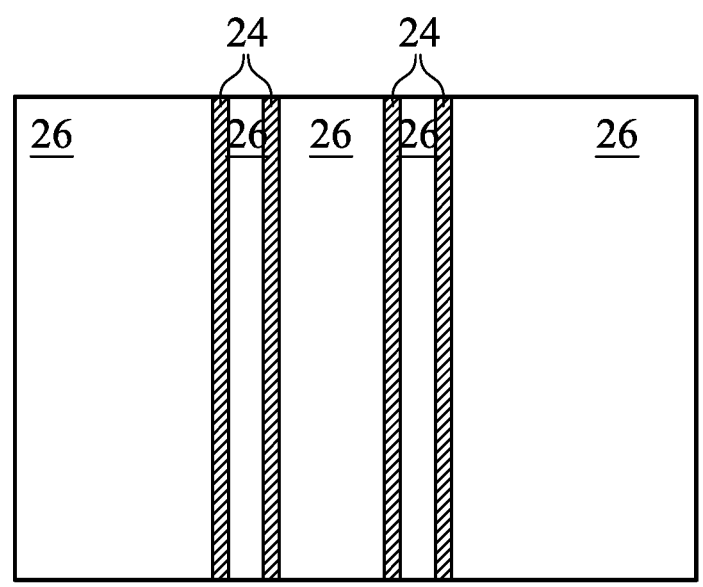

FIGS. 3A and 3B illustrate, in a cross-sectional view and top view, respectively, the formation of isolation regions 26, each in a corresponding trench. The isolation regions 26 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 26 include silicon oxide that is formed by a FCVD process. A planarization process, such as a Chemical Mechanical Polish (CMP), may remove any excess insulating material and any remaining mask (e.g., used to etch the trenches and form the fins 24) to form top surfaces of the insulating material and top surfaces of the fins 24 to be coplanar. The insulating material may then be recessed to form the isolation regions 26. The insulating material is recessed such that the fins 24 protrude from between neighboring isolation regions 26, which may, at least in part, thereby delineate the fins 24 as active areas on the semiconductor substrate 20. The insulating material may be recessed using an acceptable etch process, such as one that is selective to the material of the insulating material. For example, a chemical oxide removal using a CERTAS® etch or an Applied Materials SICONI tool or dilute hydrofluoric (dHF) acid may be used. Further, top surfaces of the isolation regions 26 may have a flat surface as illustrated, a convex surface, a concave surface (such as dishing), or a combination thereof, which may result from an etch process. As illustrated in the top view of FIG. 3B, the fins 24 extend longitudinally across the semiconductor substrate 20.

A person having ordinary skill in the art will readily understand that the processes described with respect to FIGS. 1 through 3A-B are just examples of how fins 24 may be formed. In other embodiments, a dielectric layer can be formed over a top surface of the semiconductor substrate 20; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 24 can be recessed (e.g., after planarizing the insulating material of the isolation regions 26 and before recessing the insulating material), and a material different from the fins may be epitaxially grown in their place. In an even further embodiment, a dielectric layer can be formed over a top surface of the semiconductor substrate 20; trenches can be etched through the dielectric layer; heteroepitaxial structures can be epitaxially grown in the trenches using a material different from the semiconductor substrate 20; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material for a p-type device.

Figure 4A:
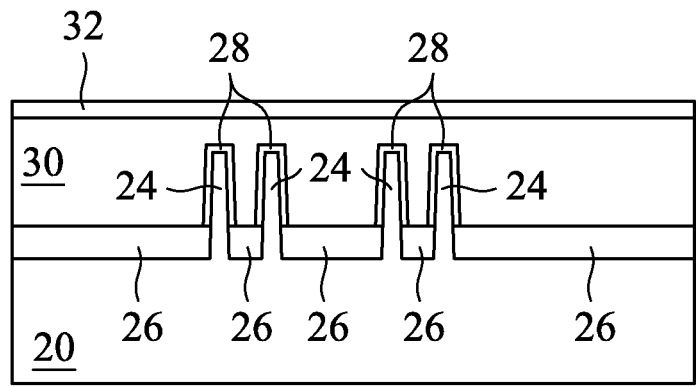
Figure 4B:
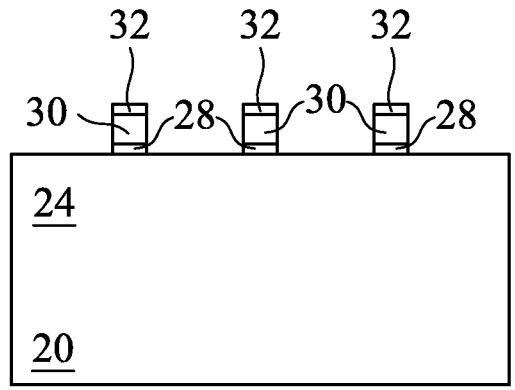
Figure 4C:
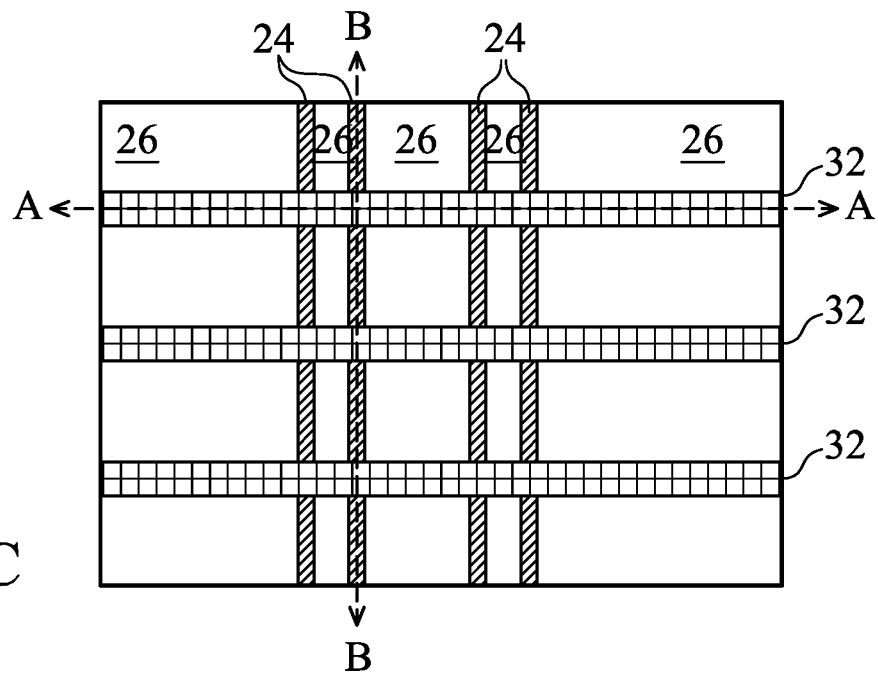
Figure 4D:
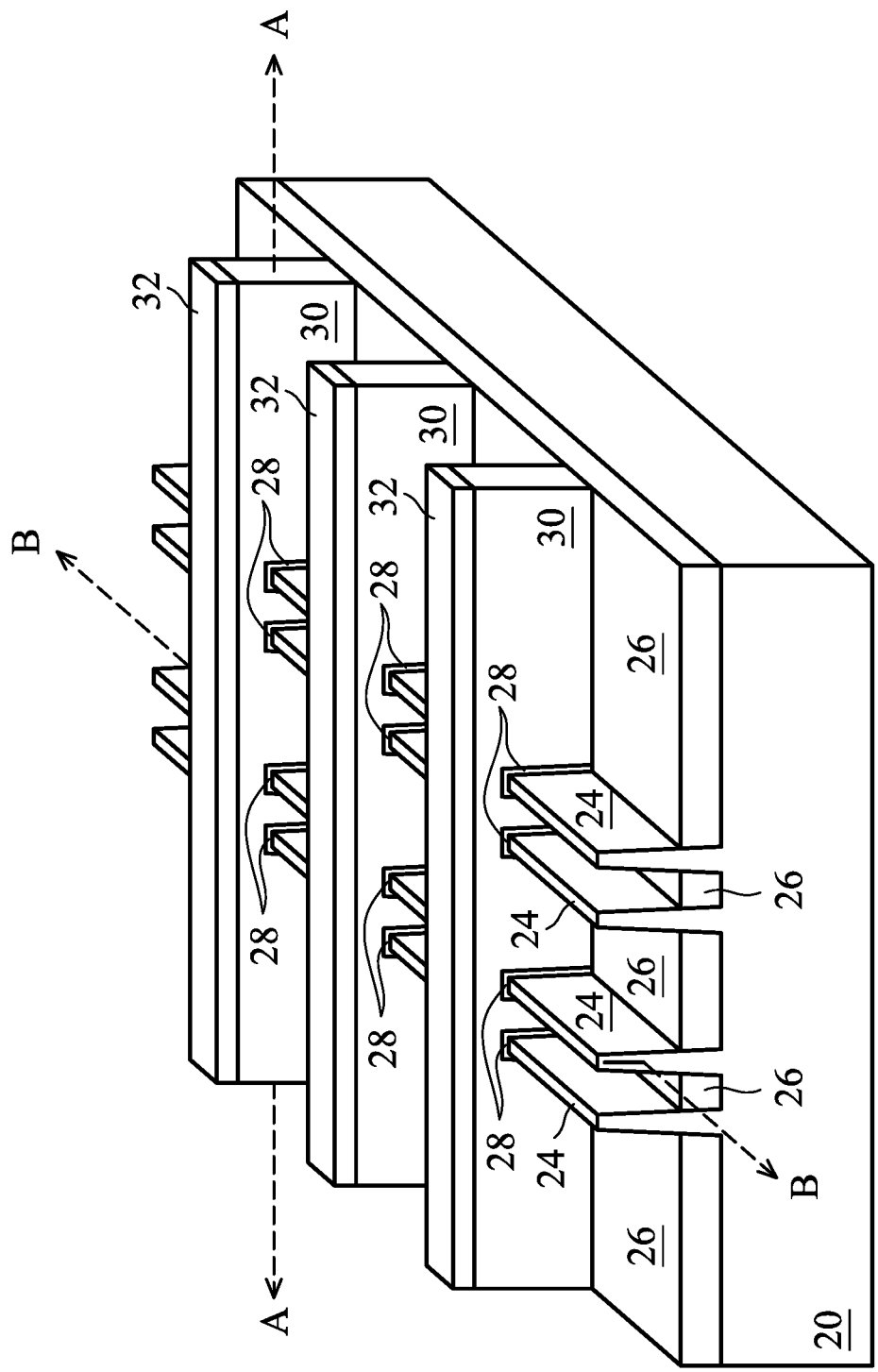

FIGS. 4A, 4B, 4C and 4D illustrate the formation of dummy gate stacks on the fins 24. FIGS. 4A and 4B illustrate cross-sectional views; FIG. 4C illustrates a top view; and FIG. 4D illustrates a three-dimensional view. FIGS. 4C and 4D illustrate cross-sections A-A and B-B. FIGS. 1, 2, 3A, 4A, and the following figures ending with an "A" designation illustrate cross-sectional views at various instances of processing corresponding to cross-section A-A, and FIGS. 4B and the following figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

The dummy gate stacks are over and extend laterally perpendicularly to the fins 24. Each dummy gate stack comprises one or more interfacial dielectrics 28, a dummy gate 30, and a mask 32. The one or more interfacial dielectrics 28, dummy gates 30, and mask 32 for the dummy gate stacks may be formed by sequentially forming respective layers, and then patterning those layers into the dummy gate stacks. For example, a layer for the one or more interfacial dielectrics 28 may include or be silicon oxide, silicon nitride, the like, or multilayers thereof, and may be thermally and/or chemically grown on the fins 24, as illustrated, or conformally deposited, such as by plasma-enhanced CVD (PECVD), ALD, or another deposition technique. A layer for the dummy gates 30 may include or be silicon (e.g., polysilicon) or another material deposited by CVD, PVD, or another deposition technique. A layer for the mask 32 may include or be silicon nitride, silicon oxynitride, silicon carbon nitride, the like, or a combination thereof, deposited by CVD, PVD, ALD, or another deposition technique. The layers for the mask 32, dummy gates 30, and one or more interfacial dielectrics 28 may then be patterned, for example, using photolithography and one or more etch processes, like described above, to form the mask 32, dummy gate 30, and one or more interfacial dielectrics 28 for each dummy gate stack.

In the illustrated example, a dummy gate stack is implemented for a replacement gate process. In other examples, a gate-first process may be implemented using gate stacks including, for example, a gate dielectric in the place of the one or more interfacial dielectrics 28, and a gate electrode in the place of the dummy gate 30. In some gate-first processes, the gate stacks may be formed using similar processes and materials as described with respect to the dummy gate stacks; although in other examples, other processes or materials may be implemented. For example, a gate dielectric may include or be a high-k dielectric material, such as having a k value greater than about 7.0, which may include a metal oxide or silicate of Hf, Al, Zr, La, Mg, Ba, Ti, Pb, multilayers thereof, or a combination thereof. A gate dielectric may also be deposited by molecular-beam deposition (MBD), ALD, PECVD, or another deposition technique. A gate electrode may also include or be a metal-containing material such as TiN, TaN, TaC, Co, Ru, Al, multi-layers thereof, or a combination thereof, and may also be deposited by CVD, PVD, or another deposition technique.

The cross-section A-A is along a dummy gate stack through which a gate cut and a fin cut will be made in subsequent figures and description. The cross-section B-B is along a fin 24 (e.g., along a channel direction in the fin 24) through which a fin cut will be made in subsequent figures and description. Cross-sections A-A and B-B are perpendicular to each other.

Figure 5A:
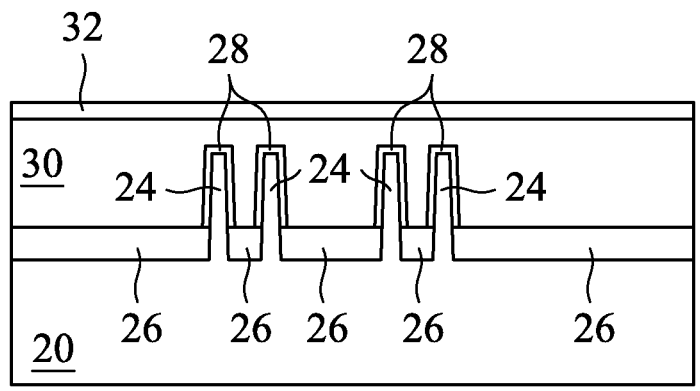
Figure 5B:
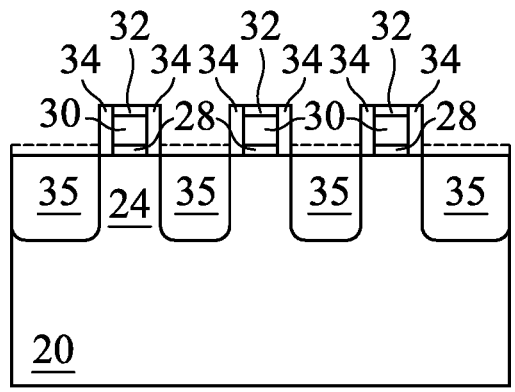
Figure 5C:
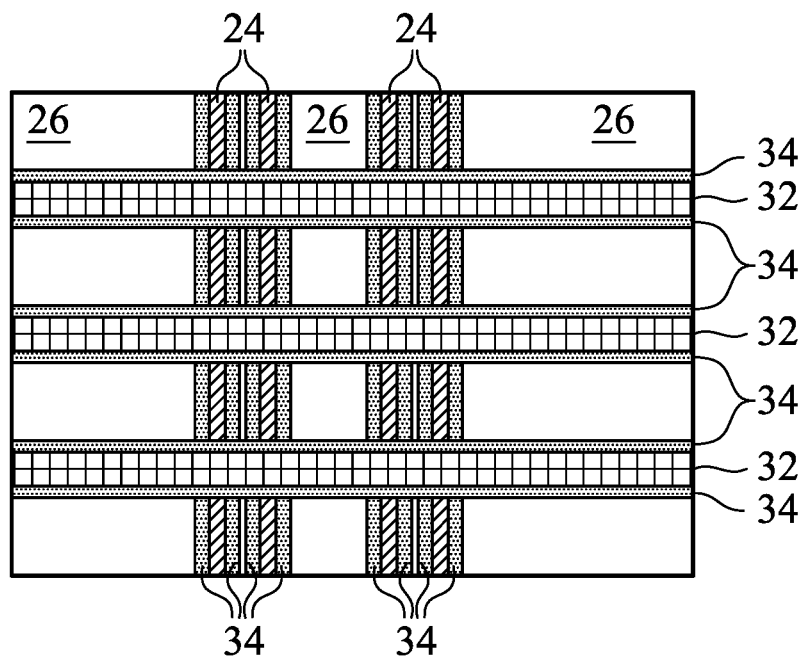

FIGS. 5A, 5B, and 5C illustrate the formation of gate spacers 34. Gate spacers 34 are formed along sidewalls of the dummy gate stacks (e.g., sidewalls of the one or more interfacial dielectrics 28, dummy gate 30, and mask 32) and over the fins 24. Residual gate spacers 34 may also be formed along sidewalls of the fins 24. The gate spacers 34 may be formed by conformally depositing one or more layers for the gate spacers 34 and anisotropically etching the one or more layers, for example. The one or more layers for the gate spacers 34 may include or be silicon carbon oxide, silicon nitride, silicon oxynitride, silicon carbon nitride, the like, multi-layers thereof, or a combination thereof, and may be deposited by CVD, ALD, or another deposition technique. The etch process can include a RIE, NBE, or another etch process.

Source/drain regions 35 are formed in the fins 24. In some examples, the source/drain regions 35 are formed by implanting dopants into the fins 24 using the dummy gate stacks and gate spacers 34 as masks. Hence, source/drain regions 35 can be formed by implantation on opposing sides of each dummy gate stack. In other examples, the fins 24 may be recessed using the dummy gate stacks and gate spacers 34 as masks, and epitaxial source/drain regions 35 may be epitaxially grown in the recesses. Epitaxial source/drain regions 35 may be raised in relation to the fin 24, as illustrated by dashed lines in FIG. 5B. The epitaxial source/drain regions 35 may be doped by in situ doping during the epitaxial growth and/or by implantation after the epitaxial growth. Hence, source/drain regions 35 can be formed by epitaxial growth, and possibly with implantation, on opposing sides of each dummy gate stack. Example dopants for source/drain regions 35 can include or be, for example, boron for a p-type device and phosphorus or arsenic for an n-type device, although other dopants may be used. The source/drain regions 35 may have a dopant concentration in a range from about $10^{19}$ cm$^{-3}$ to about $10^{21}$ cm$^{-3}$. The source/drain regions 35 are not expressly illustrated in subsequent figures to avoid obscuring other features and components depicted in those figures; however, a person having ordinary skill in the art will readily understand that the source/drain regions 35 are present in the structures depicted in those figures.

Figure 6A:
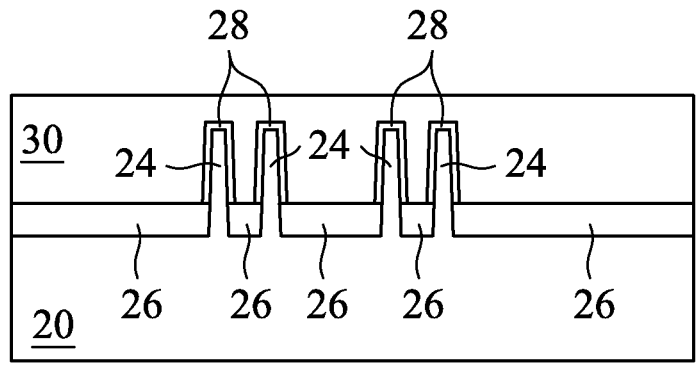
Figure 6B:
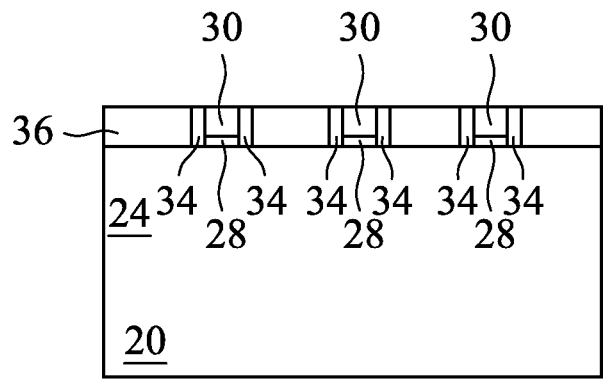
Figure 6C:
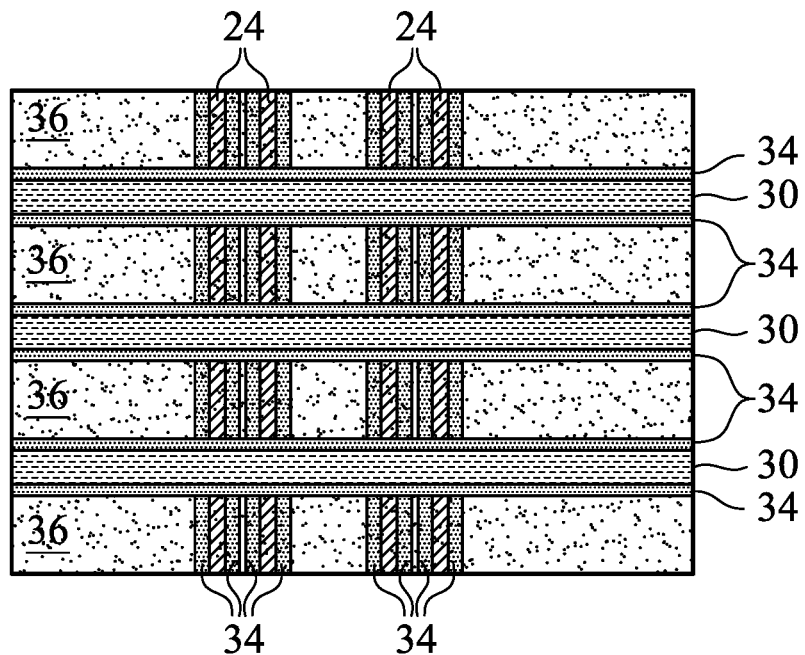

FIGS. 6A, 6B, and 6C illustrate the formation of one or more dielectric layers 36. The one or more dielectric layers 36 may include an etch stop layer (ESL) and an interlayer dielectric (ILD), for example. Generally, an etch stop layer can provide a mechanism to stop an etch process when forming, e.g., contacts or vias. An etch stop layer may be formed of a dielectric material having a different etch selectivity from adjacent layers, for example, the interlayer dielectric. The etch stop layer may be conformally deposited over the fins 24, dummy gate stacks, gate spacers 34, and isolation regions 26. The etch stop layer may comprise or be silicon nitride, silicon carbon nitride, silicon carbon oxide, carbon nitride, the like, or a combination thereof, and may be deposited by CVD, PECVD, ALD, or another deposition technique. The interlayer dielectric may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OS G), $SiO_xC_y$, Spin-On-Glass, Spin-On-Polymers, silicon carbon material, a compound thereof, a composite thereof, the like, or a combination thereof. The interlayer dielectric may be deposited by spin-on, CVD, FCVD, PECVD, PVD, or another deposition technique.

The one or more dielectric layers 36 are formed with top surface(s) coplanar with top surfaces of the dummy gates 30. A planarization process, such as a CMP, may be performed to level the top surface of the one or more dielectric layers 36 with the top surfaces of the dummy gates 30. The CMP may also remove the mask 32 (and, in some instances, upper portions of the gate spacers 34) on the dummy gates 30. Accordingly, top surfaces of the dummy gates 30 are exposed through the one or more dielectric layers 36.

Figure 7A:
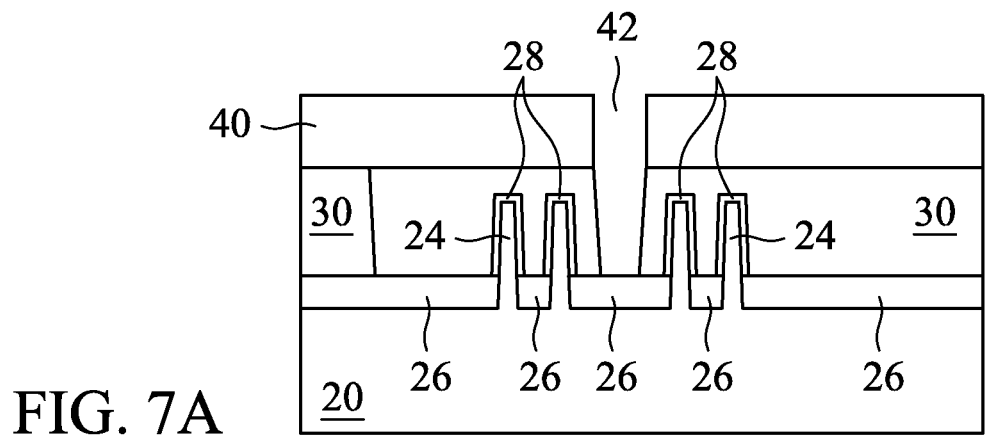
Figure 7B:
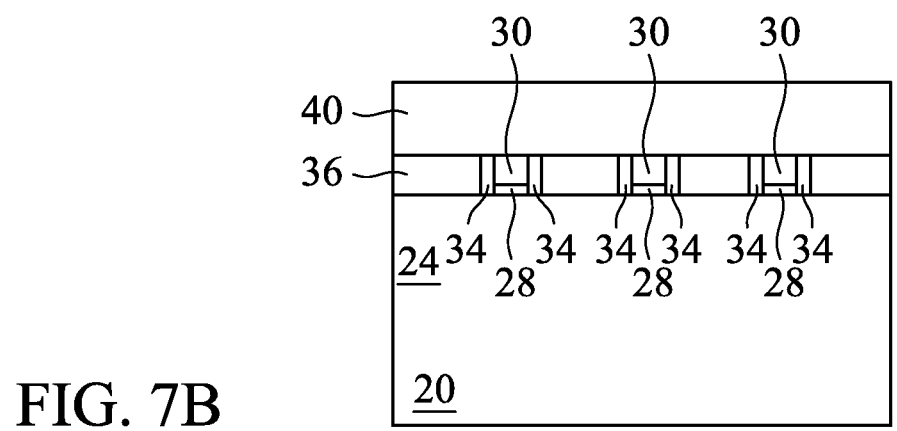
Figure 7C:
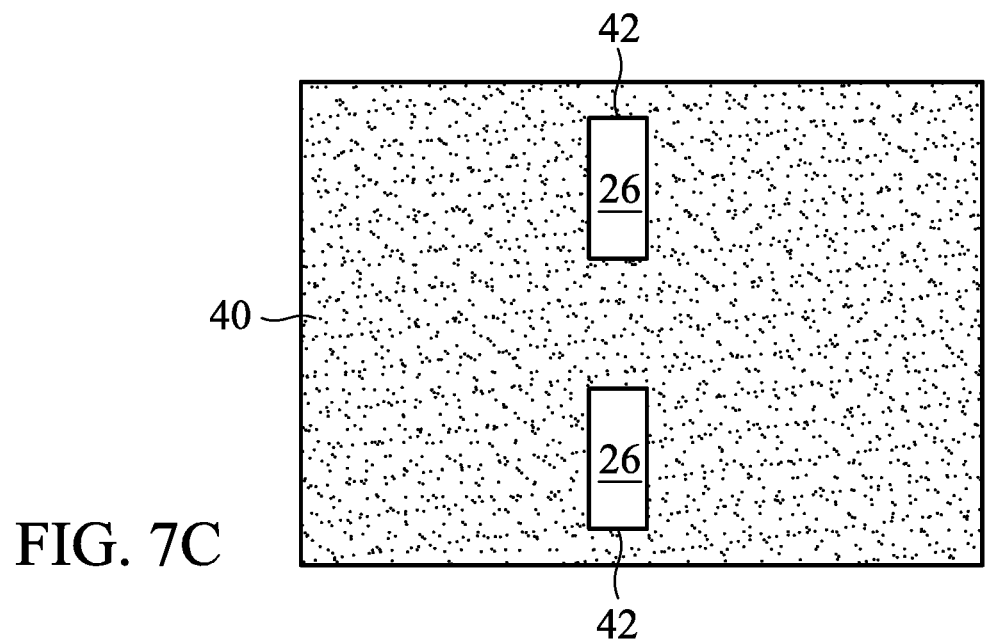

FIGS. 7A, 7B, and 7C illustrate forming cut openings 42 to cut dummy gate stacks. In the illustrated example, a mask 40 (e.g., a hard mask) is used to form the cut openings 42. For example, one or more mask layers are deposited over the dummy gate stacks, the gate spacers 34, and the one or more dielectric layers 36, and the one or more mask layers are then patterned to form the mask 40 with mask openings corresponding to the cut openings 42. In some examples, the one or more mask layers may include or be silicon nitride, silicon oxynitride, silicon carbide, silicon carbon nitride, the like, or a combination thereof, and may be deposited by CVD, PVD, ALD, or another deposition technique. The one or more mask layers may be patterned using photolithography and etch processes, as previously described. The mask 40 can have mask openings (each corresponding to a cut opening 42) extending in a direction laterally perpendicular to and intersecting the dummy gate stacks that are to be cut.

Using the mask 40, the dummy gate stacks, gate spacers 34, and one or more dielectric layers 36 may be etched such that cut openings 42 are formed cutting the dummy gate stacks. The cut openings 42 can extend to a depth to and/or into the corresponding isolation regions 26, e.g., through the dummy gates 30 and, depending on the implementation, the one or more interfacial dielectrics 28. The etch process may include a RIE, NBE, ICP etch, the like, or a combination thereof. The etching may be anisotropic.

Figure 8A:
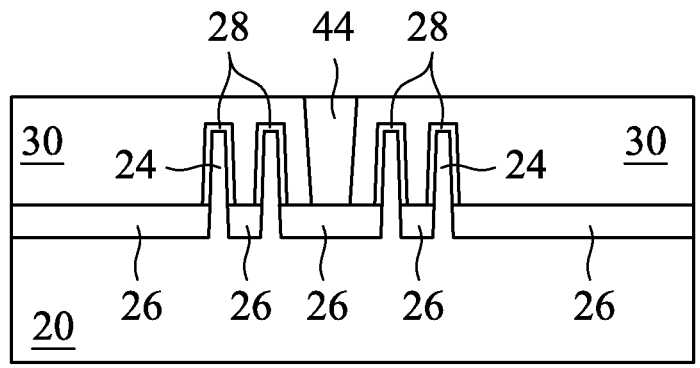
Figure 8B:
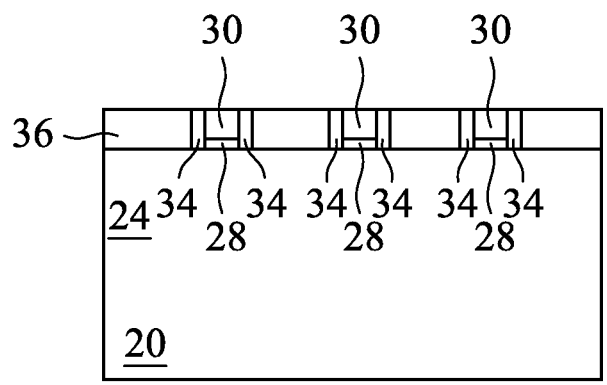
Figure 8C:
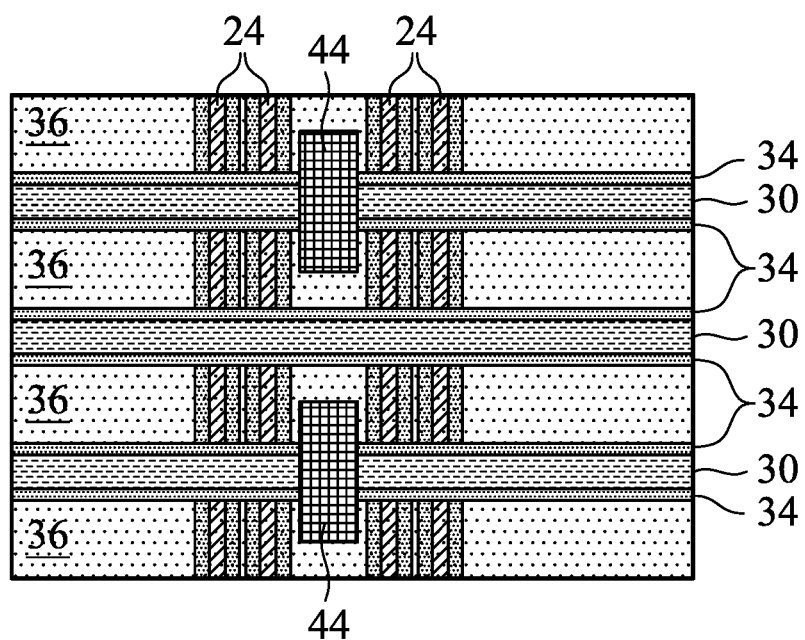

FIGS. 8A, 8B, and 8C illustrate forming gate cut-fill structures 44 in the cut openings 42. An insulating material for the gate cut-fill structures 44 is deposited in the cut openings 42 that cut the dummy gate stacks. For example, with cut openings 42 extending to a depth to and/or into the corresponding isolation regions 26 as described above, the gate cut-fill structures 44 can extend to and/or into the corresponding isolation regions 26 (e.g., a bottom surface of the gate cut-fill structure 44 can be at a depth below a top surface of the corresponding isolation region 26). In some examples, each of the gate cut-fill structures 44 may be a single insulating material, and in other examples, the gate cut-fill structures 44 may include multiple different insulating materials, such as in a multi-layered configuration. In some examples, the insulating material may include or be silicon oxide, silicon nitride, silicon oxynitride, silicon carbide, silicon carbon nitride, the like, or a combination thereof, and may be deposited by CVD, PVD, ALD, or another deposition technique. Portions of the insulating material for the gate cut-fill structures 44 and the mask 40 above the top surface of the one or more dielectric layers 36 are removed. For example, a planarization process, like a CMP, may remove the portions of the insulating material for the gate cut-fill structures 44 and the mask 40 above the top surface of the one or more dielectric layers 36, and top surfaces of the gate cut-fill structures 44 may be formed coplanar with the top surface of the one or more dielectric layers 36. The gate cut-fill structures 44 therefore electrically isolate sections of the dummy gate stacks that were cut from each other.

Figure 9A:
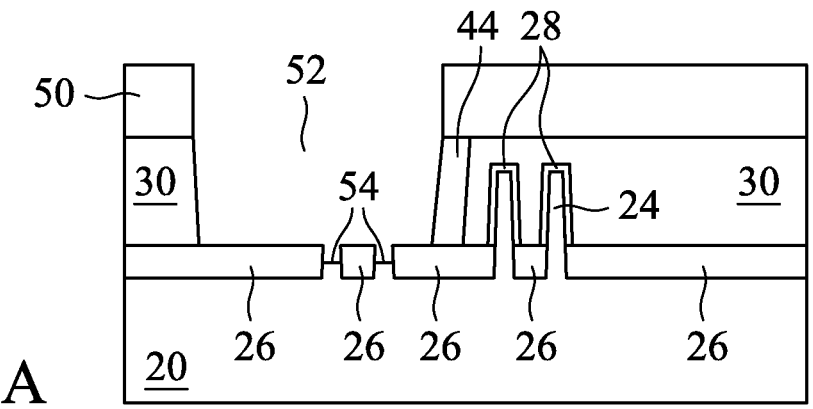
Figure 9B:
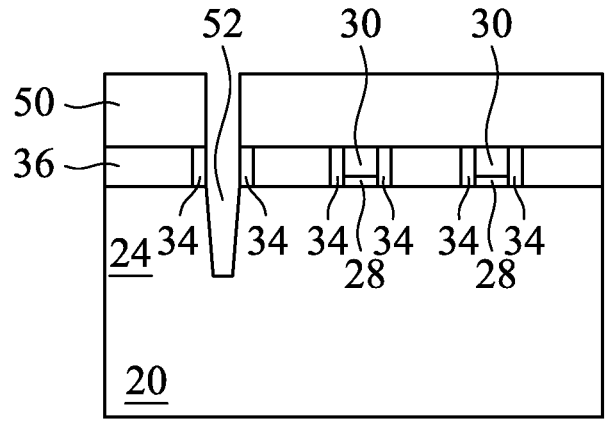
Figure 9C:
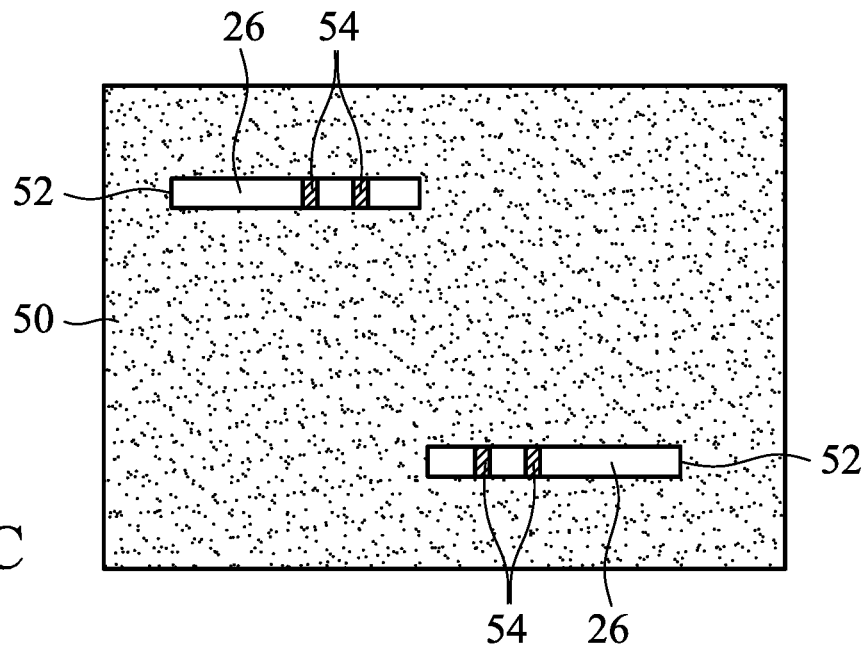

FIGS. 9A, 9B, and 9C illustrate the formation of cut openings 52 to cut fins 24. In the illustrated example, a mask 50 (e.g., a hard mask) is used to form the cut openings 52. For example, one or more mask layers are deposited over the dummy gate stacks, the gate spacers 34, the one or more dielectric layers 36, and the gate cut-fill structures 44, and the one or more mask layers are then patterned to form the mask 50 with mask openings corresponding to the cut openings 52. In some examples, the one or more mask layers may include or be silicon nitride, silicon oxynitride, silicon carbide, silicon carbon nitride, the like, or a combination thereof, and may be deposited by CVD, PVD, ALD, or another deposition technique. The one or more mask layers may be patterned using photolithography and etch processes, as previously described. The mask 50 can have mask openings (each corresponding to a cut opening 52) extending in a direction laterally perpendicular to and intersecting the fins 24 that are to be cut.

Using the mask 50, the dummy gate stacks, gate cut-fill structures 44, and fins 24 exposed by the cut openings 52 in the mask 50 are etched such that cut openings 52 are formed cutting the exposed fins 24. The cut openings 52 can extend to a depth below upper surfaces of the isolation regions 26. For example, the etching can form the cut openings 52 extending into the isolation regions 26 where fins 24 were cut. Fin cut regions 54 where the fins 24 were cut remain on the semiconductor substrate 20. The fin cut regions 54 are between neighboring isolation regions 26 and have top surfaces below the top surfaces of the neighboring isolation regions 26. The etch process may include a RIE, NBE, ICP etch, the like, or a combination thereof. The etching may be anisotropic. The mask 50 may be removed after the cut openings 52 cutting the fins 24 have been formed.

Figure 10A:
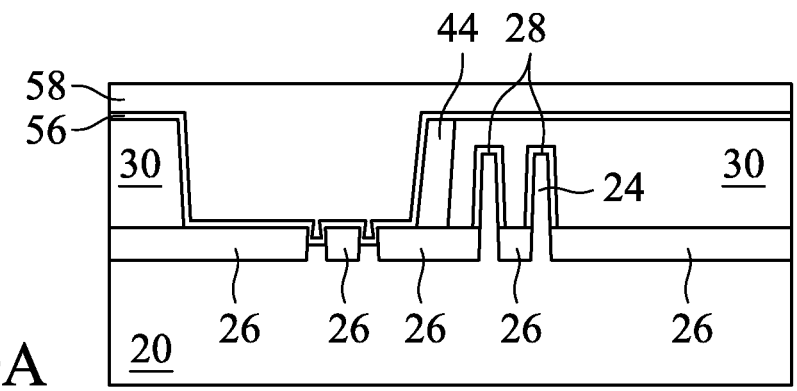
Figure 10B:
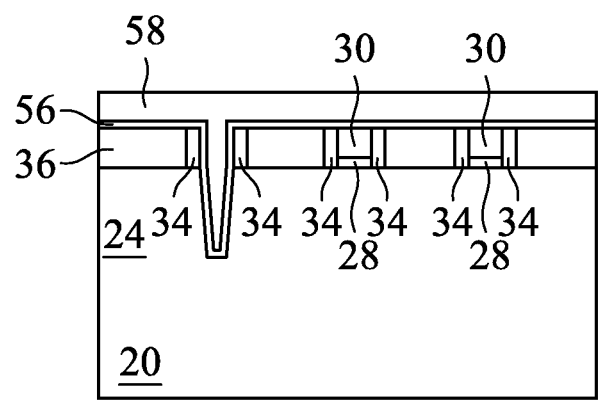
Figure 10C:
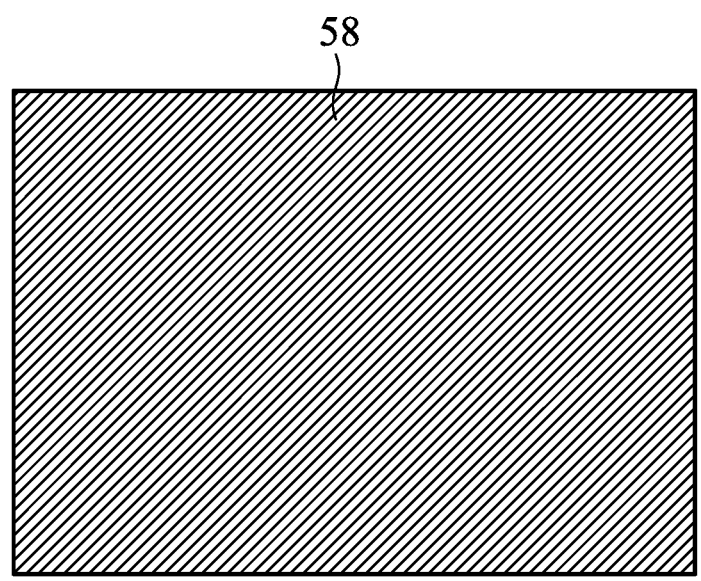

FIGS. 10A, 10B, and 10C illustrate the formation of an insulating liner 56 conformally in the cut openings 52 where the fins 24 were cut and a fill material 58 on the insulating liner 56. The insulating liner 56 may include or be a high band gap material, such as a material having a band gap that is equal to or greater than about 5 eV, which may also be equal to or greater than about twice the band gap of silicon nitride. Example high band gap materials include silicon oxide ($SiO_x$), aluminum oxide ($Al_2O_3$), titanium oxide ($TiO_x$), tantalum oxide ($TaO_x$), aluminum fluoride (AlF), aluminum oxyfluoride ($AlOF_x$), zirconium silicate ($ZrSiO_x$), hafnium silicate ($HfSiO_x$), hafnium oxide ($HfO_2$), zirconium oxide ($ZrO_2$), or a combination thereof.

Some examples use an ALD process to form the insulating liner 56. Such an ALD process may use one or more precursors such as $SiH_2[N(C_2H_5)_2]_2$, silane ($SiH_4$), oxygen ($O_2$), trimethylaluminum ($Al_2(CH_3)_6$), steam ($H_2O$), ozone ($O_3$), fluorine ($F_2$), and nitrogen trifluoride ($NF_3$) to deposit the example high band gap materials listed above or other materials, and may use a radio frequency (RF) power in a range from about 100 W to about 1,000 W, a pressure in a range from about 2 torr to about 9 torr, and a temperature in a range from about 45° C. to about 700° C. The ALD technique can provide a uniform insulating liner 56 with good step coverage.

The fill material 58 may be an insulating material. In some examples, fill material 58 may be a single insulating material, and in other examples, fill material 58 may include multiple different insulating materials, such as in a multi-layered configuration. The fill material 58 may include or be silicon nitride, silicon oxynitride, silicon carbide, silicon carbon nitride, the like, or a combination thereof, and may be deposited by ALD, thermal deposition, CVD, or another deposition technique. In an example, the fill material 58 is silicon nitride deposited by ALD or CVD.

Figure 11A:
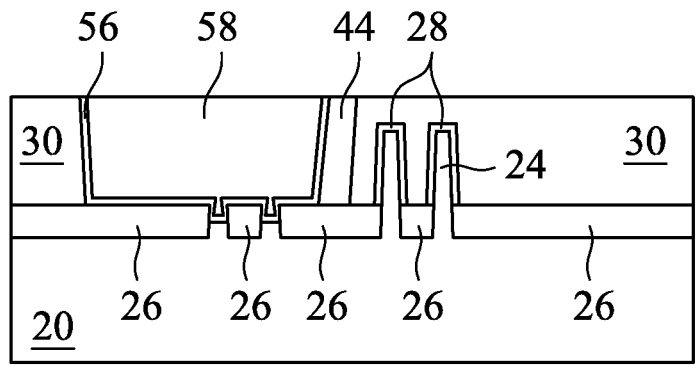
Figure 11B:
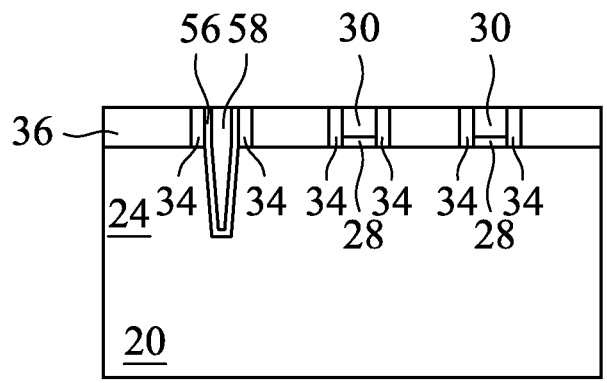
Figure 11C:
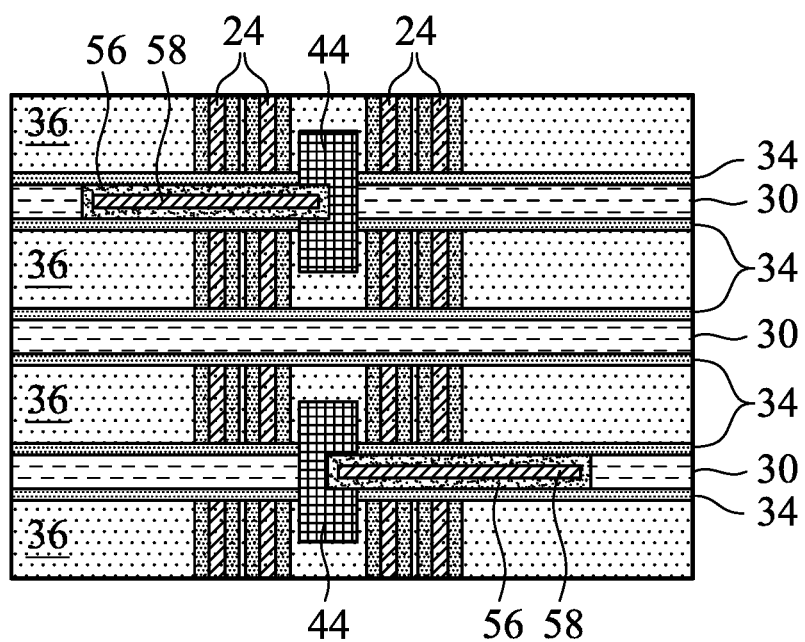

FIGS. 11A, 11B, and 11C illustrate the removal of excess portions of the fill material 58 and the insulating liner 56 above the top surface of the one or more dielectric layers 36, gate spacers 34, gate cut-fill structures 44, and dummy gate stacks to form fin cut-fill structures. For example, a planarization process, like a CMP, may remove the portions of the fill material 58 and the insulating liner 56 above the top surface of the one or more dielectric layers 36, etc., and top surfaces of the fin cut-fill structures may be formed coplanar with the top surface of the one or more dielectric layers 36, etc. The planarization process may further expose the dummy gates 30 for subsequent replacement of the dummy gate stacks. Each fin cut-fill structure includes the fill material 58 and the insulating liner 56. The cutting of the fins 24 forms fin cut-fill structures that extend laterally perpendicularly to and dissect the fins 24 that are cut. Sections of a fin 24 that were integral before the cutting of the fin 24 can be made to be electrically isolated sections from each other because of the fin cut-fill structure.

Figure 12A:
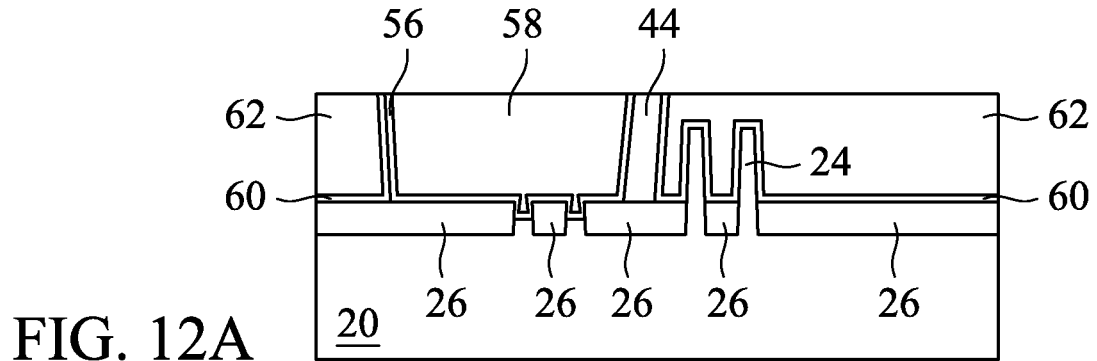
Figure 12B:
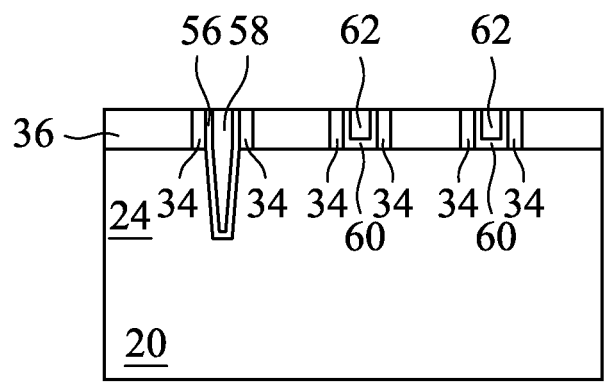
Figure 12C:
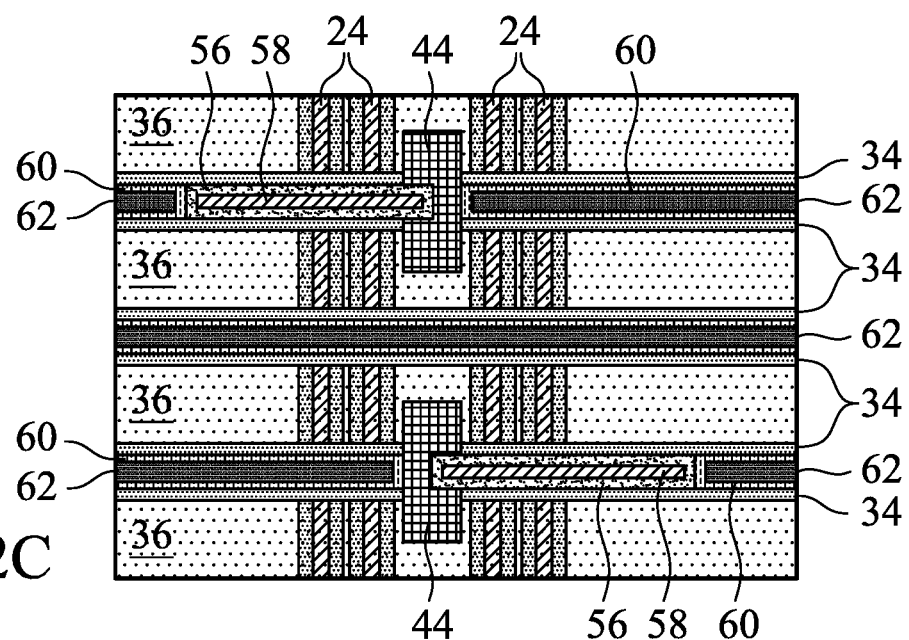

FIGS. 12A, 12B, and 12C illustrate the replacement of the dummy gate stacks with replacement gate structures. In other examples in which a gate-first process is implemented, the processing of FIGS. 12A, 12B, and 12C may be omitted. The dummy gates 30 and one or more interfacial dielectrics 28 are removed, such as by one or more etch processes. The dummy gates 30 may be removed by an etch process selective to the dummy gates 30, wherein the one or more interfacial dielectrics 28 act as etch stop layers, and subsequently, the one or more interfacial dielectrics 28 can be removed by a different etch process selective to the one or more interfacial dielectrics 28. The etch processes can be, for example, a RIE, NBE, a wet etch, or another etch process. Recesses are formed between gate spacers 34 where the dummy gate stacks are removed, and channel regions of the fins 24 are exposed through the recesses.

The replacement gate structures are formed in the recesses formed where the dummy gate stacks were removed. The replacement gate structures each include one or more conformal layers 60 and a gate electrode 62. The one or more conformal layers 60 include a gate dielectric layer and may include one or more work-function tuning layers. The gate dielectric layer can be conformally deposited in the recesses where dummy gate stacks were removed (e.g., on top surfaces of the isolation regions 26, sidewalls and top surfaces of the fins 24 along the channel regions, and sidewalls of the gate spacers 34 and gate cut-fill structures 44) and on the top surfaces of the one or more dielectric layers 36, gate spacers 34, and gate cut-fill structures 44. The gate dielectric layer can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof. The gate dielectric layer can be deposited by ALD, PECVD, MBD, or another deposition technique.

Then, if implemented, a work-function tuning layer may be conformally deposited on the gate dielectric layer. The work-function tuning layer may include or be tantalum, tantalum nitride, titanium, titanium nitride, the like, or a combination thereof, and may be deposited by ALD, PECVD, MBD, or another deposition technique. Any additional work-function tuning layers may be sequentially deposited similar to the first work-function tuning layer.

A layer for the gate electrodes 62 is formed over the one or more conformal layers 60. The layer for the gate electrodes 62 can fill remaining recesses where the dummy gate stacks were removed. The layer for the gate electrodes 62 may be or comprise a metal-containing material such as Co, Ru, Al, W, Cu, multi-layers thereof, or a combination thereof. The layer for the gate electrodes 62 can be deposited by ALD, PECVD, MBD, PVD, or another deposition technique.

Portions of the layer for the gate electrodes 62 and of the one or more conformal layers 60 above the top surfaces of the one or more dielectric layers 36, gate spacers 34, and gate cut-fill structures 44 are removed. For example, a planarization process, like a CMP, may remove the portions of the layer for the gate electrodes 62 and the one or more conformal layers 60 above the top surfaces of the one or more dielectric layers 36, gate spacers 34, and gate cut-fill structures 44. The replacement gate structures comprising the gate electrodes 62 and one or more conformal layers 60 may therefore be formed as illustrated in FIGS. 12A-C.

Figure 13A:
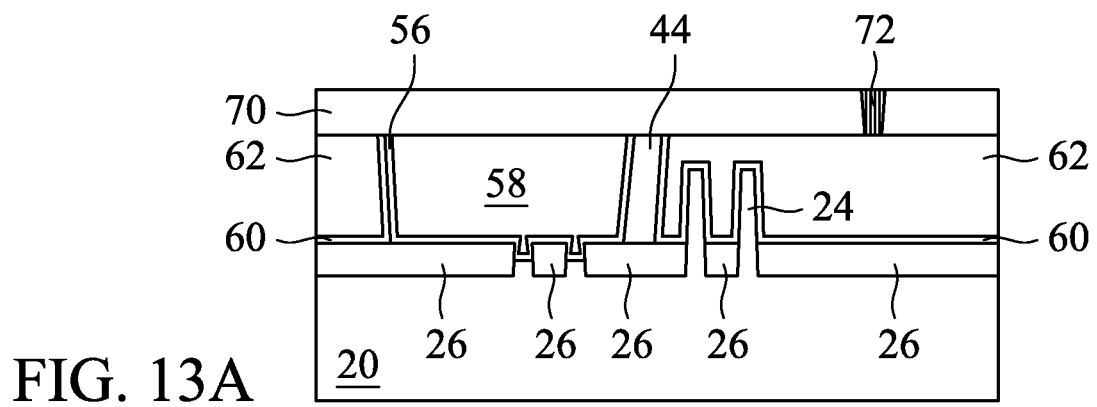
Figure 13B:
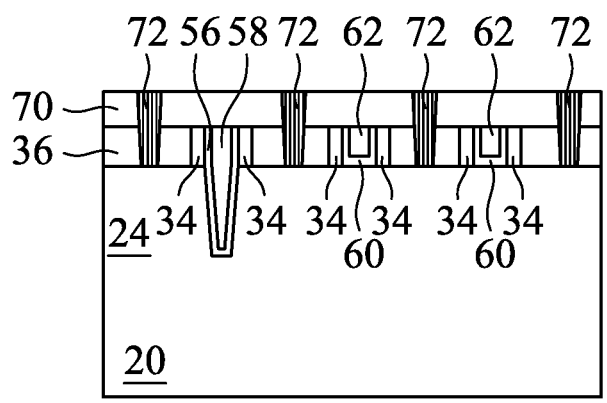
Figure 13C:
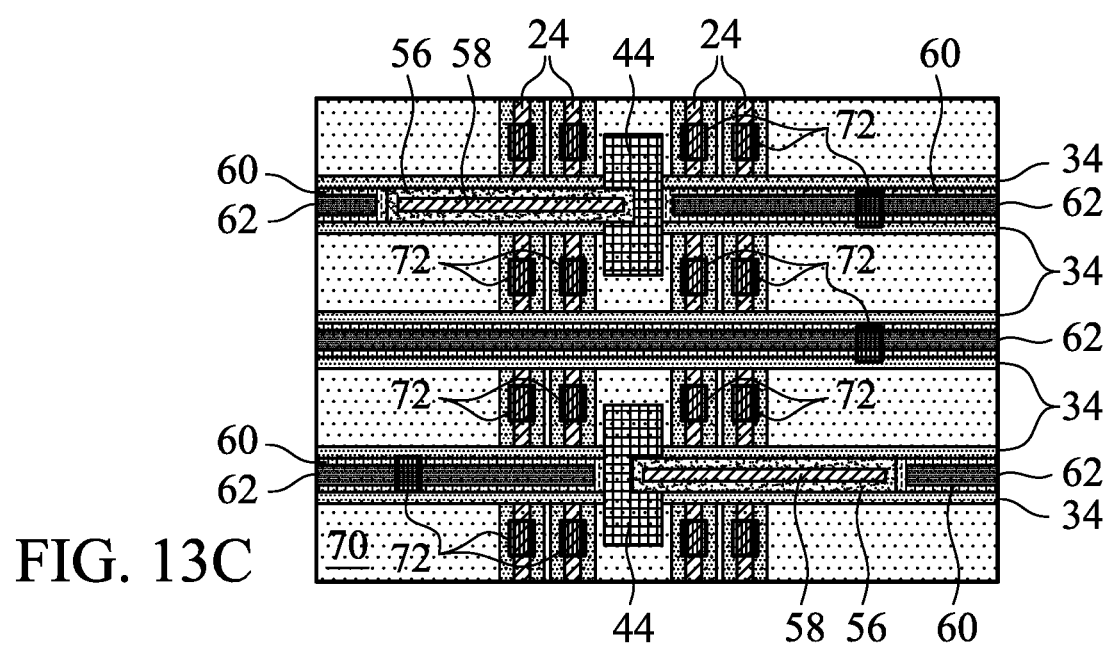

FIGS. 13A, 13B, and 13C illustrate the formation of one or more dielectric layers 70 and conductive features 72 in the one or more dielectric layers 36 and/or 70 to source/drain regions 35 of the fins 24 and to gate electrodes 62. The one or more dielectric layers 70 may include an etch stop layer (ESL) and an interlayer dielectric (ILD) or intermetal dielectric (IMD), for example. The etch stop layer may be deposited over the one or more dielectric layers 36, gate cut-fill structures 44, fin cut-fill structures, gate spacers 34, gate electrodes 62, and one or more conformal layers 60. The etch stop layer may comprise or be silicon nitride, silicon carbon nitride, silicon carbon oxide, carbon nitride, the like, or a combination thereof, and may be deposited by CVD, PECVD, ALD, or another deposition technique. The interlayer dielectric or intermetal dielectric may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The interlayer dielectric or intermetal dielectric may be deposited by spin-on, CVD, FCVD, PECVD, PVD, or another deposition technique.

Recesses and/or openings can be formed in and/or through the dielectric layers 70 and 36 to the source/drain regions 35 and gate electrodes 62 to expose at least portions of the source/drain regions 35 and gate electrodes 62, respectively. The dielectric layers 70 and 36 may be patterned with the recesses and/or openings, for example, using photolithography and one or more etch processes. The conductive features 72 may then be formed in the recesses and/or openings. The conductive features 72 may include an adhesion and/or barrier layer and conductive material on the adhesion and/or barrier layer, for example. In some examples, the conductive features 72 may include silicide regions.

The adhesion and/or barrier layer can be conformally deposited in the recesses and/or openings and over the one or more dielectric layers 70. The adhesion and/or barrier layer may be or comprise titanium, titanium nitride, titanium oxide, tantalum, tantalum nitride, tantalum oxide, the like, or a combination thereof, and may be deposited by ALD, CVD, or another deposition technique. Silicide regions may be formed on upper portions of the source/drain regions 35 by reacting upper portions of the source/drain regions 35 with the adhesion and/or barrier layer. An anneal can be performed to facilitate the reaction of the source/drain regions 35 with the adhesion and/or barrier layer.

The conductive material can be deposited on the adhesion and/or barrier layer and fill the recesses and/or openings. The conductive material may be or comprise tungsten, copper, aluminum, gold, silver, alloys thereof, the like, or a combination thereof, and may be deposited by CVD, ALD, PVD, or another deposition technique. After the material of the conductive features 72 is deposited, excess material may be removed by using a planarization process, such as a CMP, for example. The planarization process may remove excess material of the conductive features 72 from above a top surface of the one or more dielectric layers 70. Hence, top surfaces of the conductive features 72 and the one or more dielectric layers 70 may be coplanar. The conductive features 72 may be or may be referred to as contacts, plugs, etc.

As illustrated, the conductive features 72 are formed to the source/drain regions 35 of the fins 24 or to replacement gate structures to electrically couple the source/drain regions 35 or the replacement gate structures, respectively. The layout of the conductive features 72 in the figures is merely an example. A person having ordinary skill in the art will readily understand that a layout of conductive features can differ between different implementations.

Figure 14:
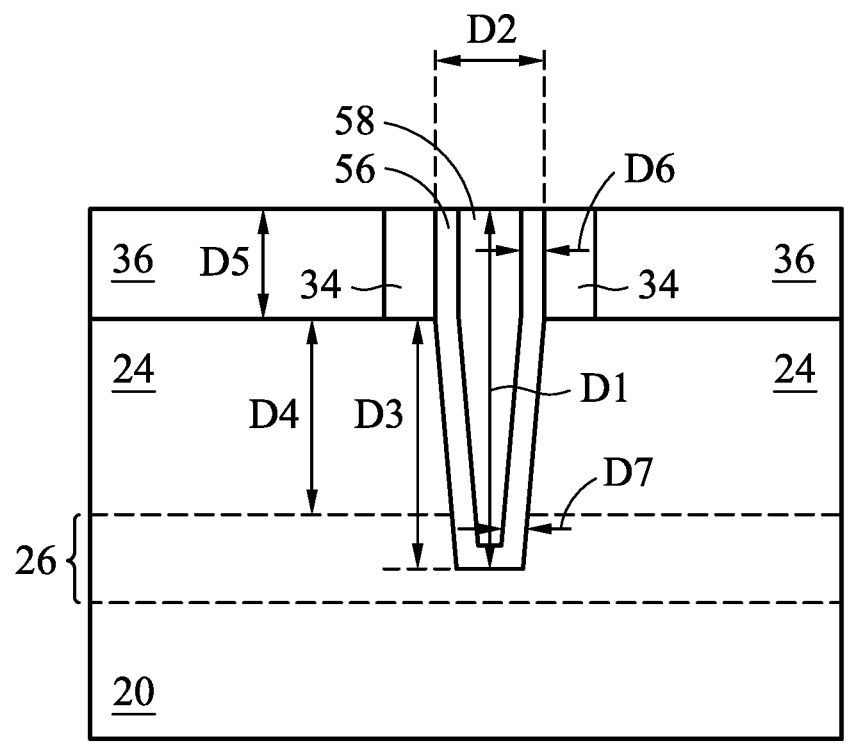
FIG. 14 is a cross-sectional view of an example fin cut-fill structure in accordance with some embodiments.

FIG. 14 illustrates a cross-sectional view of an example fin cut-fill structure in accordance with some embodiments. The fin cut-fill structure includes the insulating liner 56 and the fill material 58 as described with respect to and illustrated in previous figures. The fin cut-fill structure in the illustrated cross-section is disposed laterally between gate spacers 34 and extends vertically to a depth below a level of an upper surface of a neighboring isolation region 26 (shown in phantom). Laterally, the insulating liner 56 is disposed between a respective gate spacer 34 and the fill material 58, and between a respective section of the cut fin 24 and the fill material 58. Vertically, in the illustrated cross-section, the insulating liner 56 is disposed between (i) the semiconductor substrate 20 and/or remaining portion of a cut region of the fin 24 and (ii) the fill material 58. Vertically, in another cross-section (e.g., through an isolation region 26), the insulating liner 56 is disposed between the isolation region 26 (as shown in phantom) and the fill material 58. The insulating liner 56 is conformally disposed between the fill material 58 and other structures formed on and/or from the semiconductor substrate 20.

As illustrated, the fin cut-fill structure has a vertical dimension D1, which extends from a top surface of the fin cut-fill structure to a depth below a level of an upper surface of a neighboring isolation region 26 (as shown in phantom). The fin cut-fill structure has a lateral dimension D2 at the top surface of the fin cut-fill structure. In some examples, the vertical dimension D1 is in a range from about 200 nm to about 320 nm, and the lateral dimension D2 is in a range from about 20 nm to about 25 nm. An aspect ratio of the vertical dimension D1 to the lateral dimension D2, in some examples, is greater than or equal to about 10, such as about 13.

In some examples, the depth D3 that the fin 24 is cut is in a range from about 130 nm to about 190 nm. In some examples, a height D4 of the fin 24 is in a range from about 40 nm to about 70 nm. In some examples, a height D5 of the one or more dielectric layers 36 from a top surface of a fin 24 is in a range from about 70 nm to about 130 nm. In some examples, a thickness D6 of the insulating liner 56 at an upper portion of the fin cut-fill structure is in a range from about 2 nm to about 6 nm, and a thickness D7 of the insulating liner 56 at a lower portion of the fin cut-fill structure is in a range from about 1.6 nm to about 6 nm. In some examples, a ratio of the thickness D7 at the lower portion to the thickness D6 at the upper portion is in a range from about 1.0 to about 0.8.

Some embodiments may achieve advantages. By using a high band gap material as an insulating liner in a fin cut-fill structure, leakage between neighboring sections of a fin that was cut (e.g., sections of a fin that the fin cut-fill structure is between and abuts) can be reduced. This can lead to better wafer acceptance testing (WAT) results, and higher reliability of devices that are formed from the fins that are cut. Other advantages may be achieved.

An embodiment is a structure. The structure includes a first fin on a substrate, a second fin on the substrate, and a fin cut-fill structure disposed between the first fin and the second fin. The first fin and the second fin are longitudinally aligned. The fin cut-fill structure includes an insulating liner and a fill material on the insulating liner. The insulating liner abuts a first sidewall of the first fin and a second sidewall of the second fin. The insulating liner includes a material with a band gap greater than 5 eV.

Another embodiment is a structure. The structure includes an insulator structure disposed laterally between a first fin and a second fin. The first fin and the second fin are longitudinally aligned on a substrate. The insulator structure includes a high band gap liner disposed along respective end sidewalls of the first fin and the second fin, and includes a fill material on the high band gap liner. The high band gap liner has a band gap greater than 5 eV.

A further embodiment is a method. A fin is formed on a substrate. The fin is cut into a first section of the fin and a second section of the fin by forming a cut opening between the first section of the fin and the second section of the fin. A conformal liner layer is formed in the cut opening. The conformal liner layer includes a material with a band gap greater than 5 eV. A fill material is formed on the conformal liner layer in the cut opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a fin on a substrate;
   forming isolation regions on the substrate, where the fin protrudes above the isolation regions;
   forming a gate structure over the fin;
   forming first spacer and a second spacer adjacent the gate structure, wherein the gate structure is interposed between the first spacer and the second spacer;
   removing a first portion of the gate structure and a first portion of the fin to form a first recess, wherein the first recess extends lower than an upper surface of the isolation regions;
   forming a liner layer in the first recess; and
   after forming the liner layer, forming a fill material on the liner layer in the first recess, wherein the fill material is an insulating material.

2. The method of claim 1, wherein forming the liner layer comprises forming a conformal liner layer.

3. The method of claim 1, wherein the liner layer comprises a material having a band gap greater than 5 eV.

4. The method of claim 1, wherein the gate structure comprises a dummy gate structure, and further comprising:
   replacing the dummy gate structure with a replacement gate structure.

5. The method of claim 4, wherein replacing the dummy gate structure is performed after forming the fill material.

6. The method of claim 1, wherein the first recess exposes a sidewall of the first spacer and a sidewall of the second spacer.

7. The method of claim 1 further comprising:
   removing a portion of the gate structure to form a second recess; and
   filling a gate cut material in the second recess.

8. The method of claim 7, wherein removing the first portion of the gate structure comprises removing a portion of the gate cut material.

9. The method of claim 7, wherein removing a portion of the gate structure comprises removing a portion of the first spacer and the second spacer, wherein the second recess extends completely through the first spacer and the second spacer.

10. A method of forming a semiconductor device, the method comprising:
    forming a first fin on a substrate;
    forming a first isolation region and a second isolation region, the first fin being interposed between the first isolation region and the second isolation region, wherein the first fin extends above an upper surface of the first isolation region and the second isolation region, wherein the first isolation region and the second isolation region are dielectric;
    forming a dummy gate structure over the first fin;
    forming a first spacer and a second spacer adjacent the first fin, the dummy gate structure being interposed between the first spacer and the second spacer;
    forming one or more dielectric layers adjacent the first spacer and the second spacer;
    removing a first portion of the dummy gate structure to form a first recess;
    forming a gate cut structure in the first recess;
    removing a second portion of the dummy gate structure and a portion of the first fin to form a second recess;
    forming a fin cut-fill structure in the second recess, forming the fin cut-fill structure comprising:
       forming an insulating liner in the second recess, the insulating liner comprising a material with a band gap greater than 5 eV; and
       forming a fill material on the insulating liner, wherein a bottom surface of the insulating liner is lower than an upper surface of the first isolation region and an upper surface of a second isolation region, wherein an upper surface of the insulating liner is higher than the upper surface of the first isolation region and the upper surface of a second isolation region; and replacing a third portion of the dummy gate structure to form a gate structure disposed between the first spacer and the second spacer.

11. The method of claim 10, where forming the first recess comprises forming the first recess through the first spacer and the second spacer.

12. The method of claim 11, wherein forming the first recess comprises forming the first recess in the one or more dielectric layers.

13. The method of claim 10, wherein the insulating liner directly contacts the gate cut structure.

14. The method of claim 13, wherein the gate cut structure extends along opposing sides and an end of the fin cut-fill structure.

15. The method of claim 10, wherein a bottom surface of the fill material is lower than an upper surface of the first isolation region and an upper surface of a second isolation region.

16. A structure comprising:
a first fin and a second fin on a substrate, the first fin and the second fin having a same first longitudinal axis;
isolation regions along opposing sides of the first fin and the second fin, wherein the first fin and the second fin protrudes above an upper surface of the isolation regions;
a first gate structure and a second gate structure, the first gate structure and the structure having a same second longitudinal axis;
a gate cut structure interposed between the first gate structure and the second gate structure, the gate cut structure having a third longitudinal axis parallel to the first longitudinal axis, wherein the gate cut structure directly contacts the second gate structure; and
a fin cut structure interposed between the first gate structure and the second gate structure, the fin cut structure having a fourth longitudinal axis parallel to the second longitudinal axis, wherein the fin cut structure comprises:
an insulating liner comprising a material with a band gap greater than 5 eV; and
a fill material on the insulating liner, wherein a bottom surface of the insulating liner is lower than an upper surface of the isolation regions, wherein an upper surface of the insulating liner is higher than the upper surface of the isolation regions.

17. The structure of claim 16, wherein the gate cut structure is along opposing sides of the fin cut structure.

18. The structure of claim 16 further comprising:
one or more dielectric layers over the isolation regions, wherein the one or more dielectric layers is on opposing sides of the gate cut structure.

19. The structure of claim 16 further comprising:
a first gate spacer and a second gate spacer, wherein the first gate structure is interposed between the first gate spacer and the second gate spacer, wherein the fin cut structure is interposed between the first gate spacer and the second gate spacer.

20. The structure of claim 16, wherein the fin cut structure directly contacts the first gate structure.

* * * * *